United States Patent [19]

Pfiester et al.

[11] Patent Number: 4,728,619
[45] Date of Patent: Mar. 1, 1988

[54] FIELD IMPLANT PROCESS FOR CMOS USING GERMANIUM

[75] Inventors: James R. Pfiester; John R. Alvis, both of Austin, Tex.; Orin W. Holland, Oak Ridge, Tenn.

[73] Assignee: Motorola, Inc., Schaumburg, Ill.

[21] Appl. No.: 63,934

[22] Filed: Jun. 19, 1987

[51] Int. Cl.[4] ................ H01L 21/263; H01L 21/22
[52] U.S. Cl. .......................... 437/34; 357/42; 357/91; 437/29; 437/44; 437/56; 437/70
[58] Field of Search .............. 437/34, 29, 44, 56, 437/70; 357/42, 91

[56] References Cited

U.S. PATENT DOCUMENTS

| | | | |
|---|---|---|---|
| 4,098,618 | 7/1978 | Crowder et al. | 437/24 |
| 4,277,299 | 7/1981 | Cerofouni et al. | 437/34 |
| 4,435,895 | 3/1984 | Parrillo et al. | 437/34 |
| 4,459,741 | 7/1984 | Schwabe et al. | 437/34 |
| 4,466,171 | 8/1984 | Jochems | 437/34 |
| 4,562,638 | 1/1986 | Schwabe et al. | 437/34 |

*Primary Examiner*—Upendra Roy
*Attorney, Agent, or Firm*—John A. Fisher; Jeffrey Van Myers; David L. Mossman

[57] ABSTRACT

A complementary metal-oxide-semiconductor (CMOS) isolation structure where the field isolation structure between the adjacent areas of different conductivity types has a channel stop doped with boron or phosphorus affected by germanium. The dual use of germanium and a second dopant selected from the group of phosphorus and boron provides a more precisely placed channel stop, since the germanium retards the diffusion of the boron and phosphorus and surprisingly provides improved width effect for the devices in the well where the channel stop is employed. Alternatively, the germanium may be placed in such a manner as to avoid retarding absorption of boron or phosphorus into the field oxide and retard its diffusion over the well of a different conductivity type where it is not desired.

22 Claims, 20 Drawing Figures

FIELD IMPLANT PROCESS FOR CMOS USING GERMANIUM

FIELD OF THE INVENTION

The invention relates to methods for manufacturing complementary metal-oxide-semiconductor (CMOS) integrated circuits, and more particularly relates to processes for forming isolation regions between the wells of different conductivity types in CMOS integrated circuits.

BACKGROUND OF THE INVENTION

It is well known that the construction of CMOS integrated circuits generally begins with the fabrication of a semiconductor substrate surface of two different conductivity types, usually in the form of regions of n-conductivity type adjacent regions of p-conductivity type. In one form, such a surface could be a p-type substrate having a n-well or tub region formed therein. Thus, the p-channel devices are formed in the n-well and the n-channel devices are formed in the surface that remains p-conductivity type. More recently, both n- and p-conductivity wells have been formed within the substrate, which is often lightly doped, n− conductivity type. As the dimensions of integrated circuit MOS devices have become smaller, there is an increased danger of punchthrough currents occurring, for example, between the p+ source/drain regions of the p-channel devices in the n-wells and the adjacent p-wells. Essentially, a parasitic device is formed across the interface between the n- and p-conductivity regions. This phenomenon will occur even with the field isolation region in place. The voltage necessary to turn on this parasitic device is termed the "field threshold voltage" and is assigned the symbols $V_{TPF}$ for n-well field threshold voltage and $V_{TNF}$ for p-well field threshold voltage.

A straight-forward approach for solving this problem would be to increase the doping in the wells. However, such a technique undesirably degrades the performance of the devices in the wells. The customary solution that has evolved in answer to the problem is to use a channel stop structure beneath the field isolation region to prevent the punchthrough currents from passing through the well interface. Typically, a dopant is introduced into a substrate before the formation of the isolation region, and during the formation of the isolation region, the channel stop structure is pushed into the substrate.

Shown in FIG. 1 is a semiconductor substrate 10 having a p-well 12 and n-well 14 formed by known processes. The substrate 10 is covered by a pad oxide layer 16 to protect the silicon from implant damage, and the future active device regions are covered by patterned nitride layer 18 where the exposed oxide regions between nitride regions 18 constitute the areas where the field isolation structures are to be formed. Masking the n-well 14 is photoresist mask 20 which protects n-well 14 from the boron implant schematically illustrated by the circle symbols. As shown, the nitride 18 over the p-well 12 also masks the boron implant from the future n-channel device active area. As a result, the boron channel stop implant only enters p-well 12 adjacent the interface 22 between the two wells 12 and 14.

Subsequent to the step shown in FIG. 1, the photoresist layer 20 is removed and a conventional local oxidation of silicon (LOCOS) process is performed to grow field silicon dioxide isolation regions 24 between the patterned nitride areas 18, which are subsequently removed to give the structure seen in FIG. 2. The heating step of the LOCOS process also anneals and activates the boron implanted in FIG. 1 to form a channel stop 26 beneath the central isolation region 24. Unfortunate problems with the use of boron as a dopant to form the channel stop region 26 as shown in FIG. 2 include the fact that it may migrate to an undesirable location, such as deeper than the desired position, and the fact that the boron may be absorbed by the isolation region 24. Additionally, the boron may also become diffused and less concentrated than desired in the preferred channel stop positions, as a result of one or both of these problems. It will be understood that the region 26 does not have a sharply defined boundary as might be suggested by the illustration. It is beneficial to analyze the boron distribution one dimensionally using a spreading resistance profile (SRP) for the channel stop 26, as seen in FIG. 14. Channel stop 26 of FIG. 2 is most accurately represented by the curve on the right for boron only. In this curve the boron impurity present has clearly diffused out from its position of greater concentration nearer the surface of the substrate, x=0 microns (um). The curve to the left is more illustrative of the desired dopant distribution for a channel stop structure. The peak of the boron doping 26 illustrated in FIG. 2 is lower than desired, and the resultant channel stop may undesirably permit punchthrough currents. The incorrect positioning of the channel stop 26 dopant peak concentration is more likely to occur due to subsequent processing of the semiconductor wafer as other device features are formed which require thermal cycles, which are the causes of the dopant redistribution.

Thus, it would be advantageous if the channel stop structures for adjacent CMOS wells could be improved with respect to preventing punchthrough currents but at the same time avoiding over-doping the wells.

SUMMARY OF THE INVENTION

Accordingly, it is an object of the present invention to provide a method for forming channel stop structures at the interface of wells of two different conductivity types in a CMOS integrated circuit.

Another object of the invention is to provide a method for fabricating channel stop structures where the structures may be precisely placed beneath the device isolation structures.

It is another object of the present invention to provide a method for fabricating channel stop structures that improves the narrow width effect for the devices in the well with the channel stop.

Still another object of the invention is to provide a process for fabricating channel stop structures that permits the use of a lower doping concentration than is conventional for the channel stop regions.

In carrying out these and other objects of the invention, there is provided, in one form, a process for providing an isolation structure between regions of different conductivity types in a complementary metal oxide semiconductor (CMOS) integrated circuit. The process begins by providing a semiconductor substrate having a surface containing areas of different types, which are typically p-conductivity areas or wells and n-conductivity areas or wells, which are adjacent one another at interfaces. Next are provided germanium/second dopant regions in one type of the areas in the substrate, as well as second dopant regions without germanium in the other type of areas in the substrate, where the second dopant is selected from the group consisting of boron and phosphorus. The germanium/second dopant regions and the second dopant regions without germanium are adjacent to the interfaces between the different conductivity areas. Then, a mask is provided over the substrate, where the mask exposes at least the interfaces or a structure overlying the interfaces between the p-conductivity areas and the n-conductivity areas. Finally, field isolation structures are formed at the interfaces between the p-conductivity areas and the n-conductivity areas, where channel stop regions containing the second dopant form beneath the field isolation structures.

It will be appreciated that the drawings in FIGS. 1 through 9 are not to scale, particularly with respect to the vertical dimensions of the CMOS structures, for clarity.

DETAILED DESCRIPTION OF THE INVENTION

Figure 1:
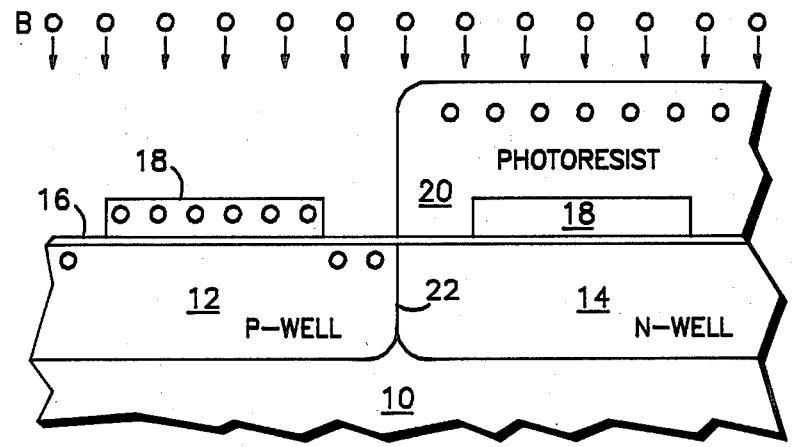
FIG. 1 is a cross-sectional illustration of a CMOS integrated circuit under construction showing an implantation step prepatory to forming a channel stop in accordance with a prior art method.
Figure 2:
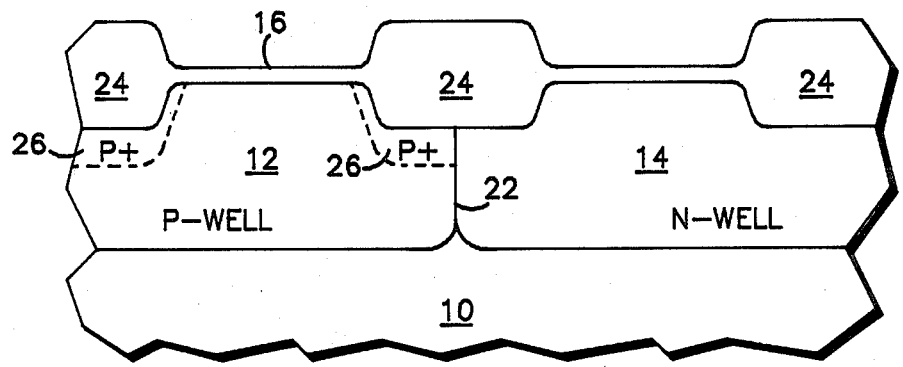
FIG. 2 is a cross-sectional illustration of the CMOS integrated circuit under construction in FIG. 1 where the isolation regions have been formed and a conventional channel stop has been created beneath the isolation regions, there being no mechanism present to prevent the dopant in the channel stop region from undesirably redistributing.
Figure 3:
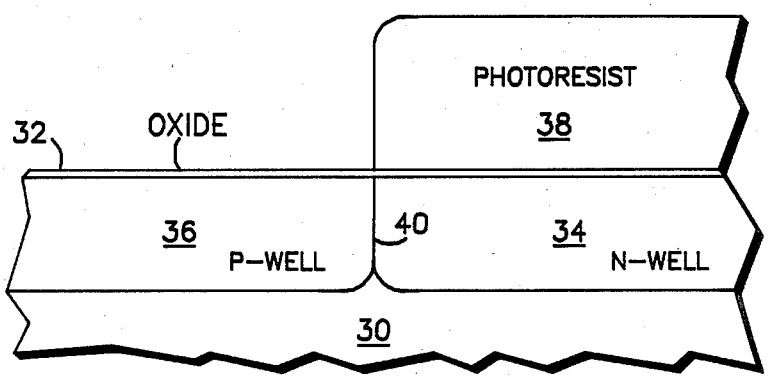
FIG. 3 is a cross-sectional illustration of another CMOS integrated circuit under construction showing a conventional technique for forming adjacent wells of different conductivity types.

Shown in FIG. 3 is a CMOS integrated circuit under construction where the semiconductor substrate 30 has formed thereon a protective pad material 32 to protect the surface of the semiconductor material from ion implant damage, should this technique of doping introduction be used. It will be appreciated that other methods of dopant introduction may be employed including, but not limited to, various masked diffusion techniques. N-well 34 and p-well 36 may be formed by a masked ion implantation, and the photoresist mask 38 used to mask the n-well 34 during the p-well 36 implantation is illustrated. Various self-alignment techniques are known to ensure that the interface 40 is narrow so that n-well 34 and p-well 36 may be placed as close together as possible.

It will be appreciated that the method of the present invention may be performed just as easily and with similar benefits if an n-well is formed in a p-conductivity substrate or a p-well is fabricated in a n-conductivity substrate, or even if two wells are formed in a substrate of any type, as illustrated in FIGS. 3–12. Further, the semiconductor substrate 10 may be any of the known semiconductor materials and the pad material of layer 32 may be any suitable composition. However, for purposes of illustration, substrate 30 will be taken as monocrystalline silicon and the pad of protective material 32 is assumed to be silicon dioxide.

Next, photoresist layer 38 is stripped off, and the substrate 30 is provided with a layer of hard mask material, 42, which for purposes of illustration only herein is taken to be silicon nitride. Nitride layer 42 is patterned using photoresist layer 44 to expose future field isolation areas 46, whereas the portions covered by the nitride pattern 42 protect the future active regions where the MOS devices are to be ultimately fabricated. This structure is shown in FIG. 4.

Figure 4:
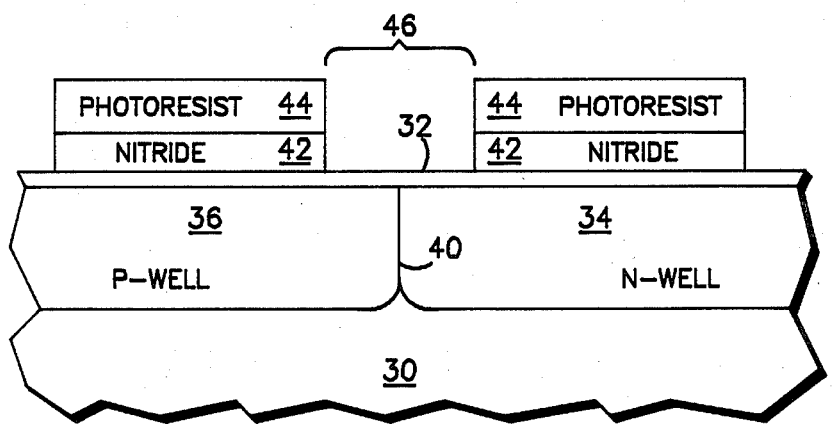
FIG. 4 is a cross-sectional illustration of the structure of FIG. 3 wherein a nitride layer has been patterned thereon using photoresist to mask the future active regions prepatory to forming isolation regions between the two wells.
Figure 5:
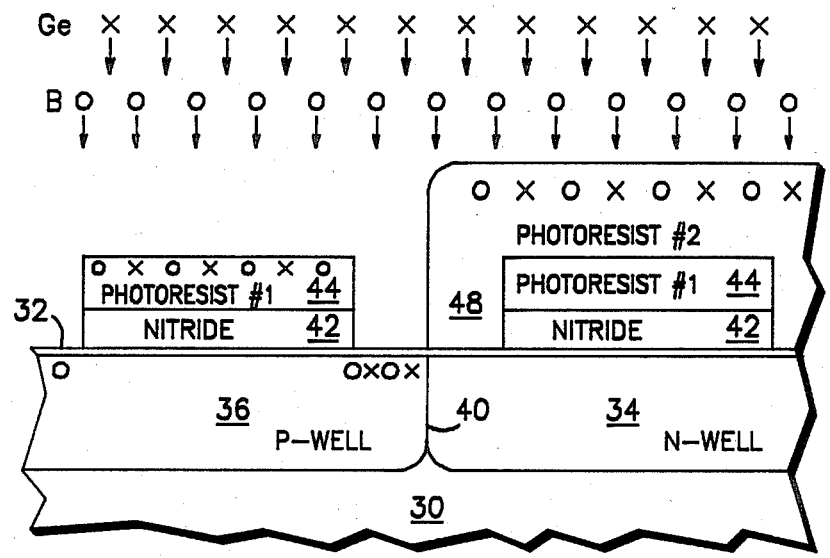
FIG. 5 is a cross-sectional illustration of the CMOS integrated circuit under construction of FIG. 4 wherein a masked implant of the structure to form the eventual p-well channel stop is schematically shown being performed.

Shown in FIG. 5 is the structure of FIG. 4 where the n-well 34 region is again protected by patterned photoresist layer 48. But additionally, as noted, the future active regions of the p-well 36 are also masked by nitride pattern 42. Thus, the wafer is ready for the p-well 36 channel stop implant as illustrated. The photoresist layer 44 may optionally be allowed to remain under photoresist pattern 38 and during the implant shown in FIG. 5.

In accordance with one embodiment of the method of the invention, two elements are introduced at this point, germanium and boron, as schematically shown in FIG. 5 with boron being represented by the circle symbols and germanium represented by the x symbols. It is immaterial to the practice of the invention whether the boron and germanium are introduced together or separately, or if separately, in what order they are placed. Further, the method of introduction is not material to the invention, although ion implantation is suggested as deserving important consideration. As illustrated in FIG. 5, both germanium and boron are introduced into the future field isolation region of the p-well 36. Additionally, the boron implant may be a blanket implant, if desired, that is, an unmasked implant into both the p-well 36 and n-well 34. This may be desirable if the threshold voltage of the p-channel devices in n-well 34 needs adjustment, as in a channel implant or the like. It should be noted that the method and structure of the invention does not preclude, and is compatible with other doping adjustments.

Germanium is introduced in the same location with the boron as shown in FIG. 5 because it is found that germanium in the presence of boron significantly retards the diffusivity of boron in silicon under the application of heat. See, for example, V. A. Panteleev, et al., "Influence of Elastic Stresses on Diffusion Processes in Semiconductors," *Sov. Phys. Solid State*, Vol. 20, No. 2, February, 1978, pp. 324–325; E. V. Dobrokhotov, et al., "Influence of Dislocation Structures on the Diffusion of Group III–V Elements in Silicon and Germanium," *Sov. Phys. Solid State*, Vol. 18, No. 9, September, 1976, pp. 1640–1641; and R. B. Fair, "Modeling of Dopant Diffusion During Rapid Thermal Annealing," *J. Vac. Sci. Technol.*, Vol. A4, No. 3, May/June, 1986, pp. 926–932.

Some of these references also report the known effect of geranium to retard phosphorus diffusion as well. It is expected that the method of this invention could be employed to provide a phosphorus doped channel stop in the n-well region adjacent the interface between the wells similarly to the boron doped channel stop in the p-well region. Of course, the respective processes would have to be altered. In the case of providing a zone of germanium and phosphorus to inhibit the phosphorus from diffusing from the n-well silicon, the germanium peak concentration would be placed as shallow or more shallowly than the phosphorus peak concentration. In turn, if the goal was to inhibit the phosphorus from diffusing into the p-well so that it would segregate relatively faster into the growing oxide, the peak germanium concentration would be placed below the peak phosphorus concentration in the p-well. The method and structure of the present invention will be further described with respect to the use of boron as the second dopant exclusively, but it should be remembered that phosphorus may also be employed in the method and structure of the invention to form an improved channel stop region in the n-well adjacent the well interface. Additionally, it is contemplated that the method of this invention could be employed to provide a suitable p+ and n+ channel stop regions in both the p- and n-wells, respectively.

Figure 6:
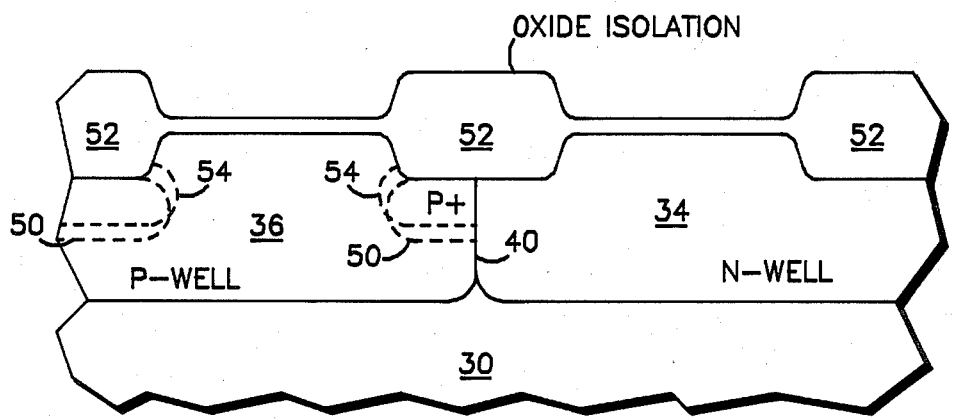
FIG. 6 is a cross-sectional illustration of the interface of the CMOS integrated circuit under construction of FIG. 5 wherein a field isolation region has been formed between the two wells of different conductivity types and a channel stop region just beneath the field isolation region has been fabricated in accordance with the method of the present invention.
Figure 8:
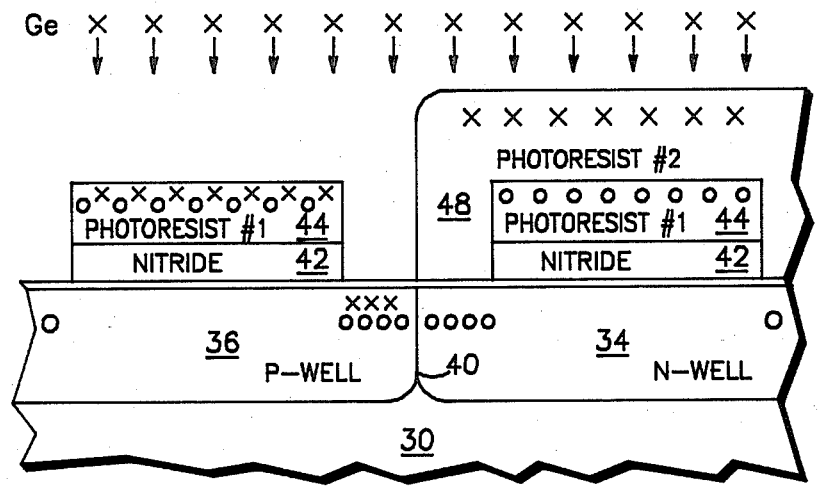
FIG. 8 is a cross-sectional illustration of the CMOS integrated circuit under construction of FIG. 7 wherein a masked germanium implant of the structure is being conducted.
Figure 14:
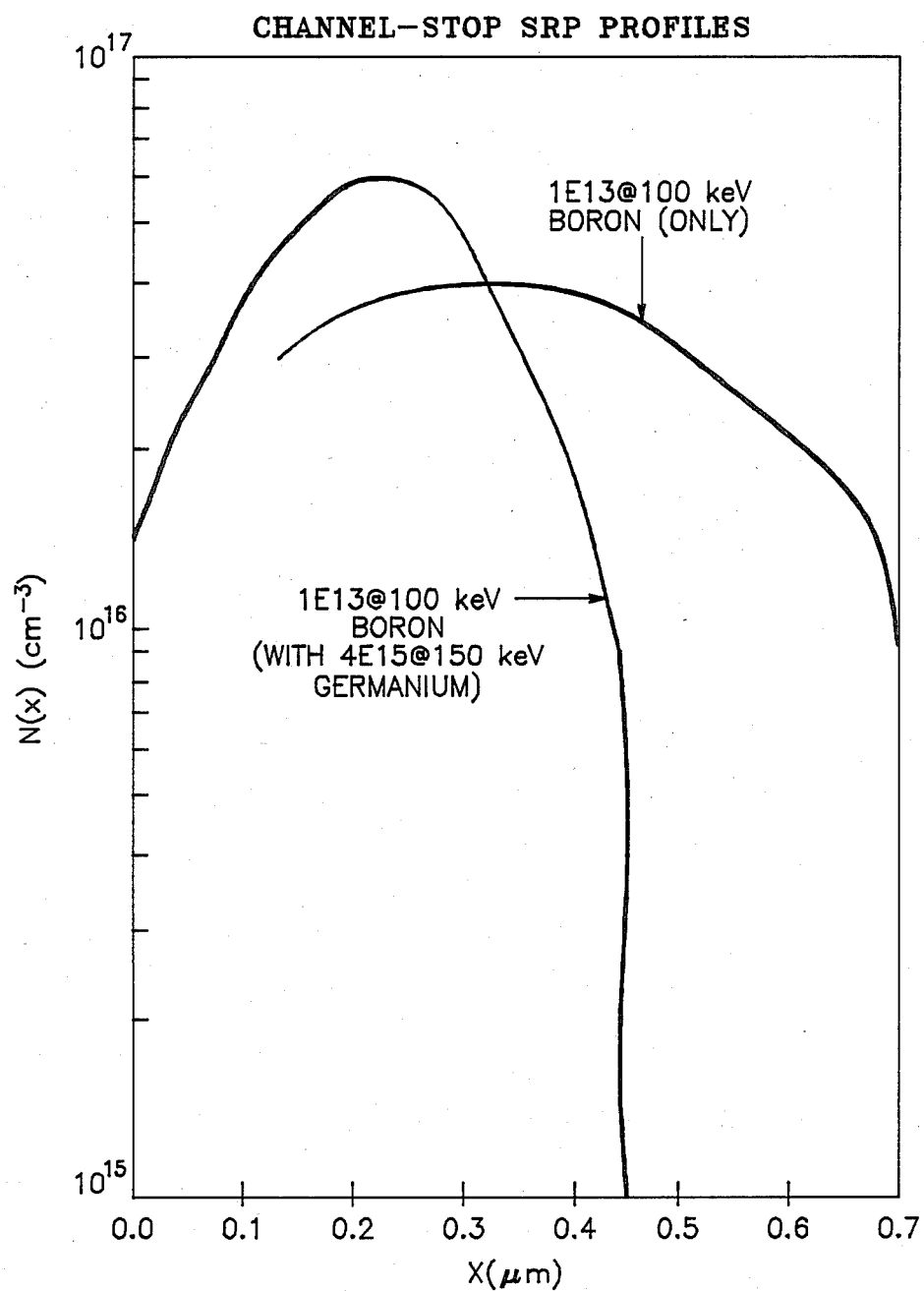
FIG. 14 is a plot of the channel stop SRPs for the structures of Example 1, showing the boron concentration per $cm^3$ as a function of depth into the substrate (x)

As mentioned, germanium assists in the more precise placement of the boron channel stop 50 more directly beneath the field isolation region 52 of FIG. 6, since it retards its diffusion during the field isolation region growth 52, and also during subsequent heat cycles, as shown in FIG. 14. With boron only, the boron dopant is not retarded and more free to disperse outwardly as shown in the concentration profile to the right. However, with germanium present in a common zone with the boron, as shown by FIGS. 5 and 8, boron diffusion is inhibited, and the concentration profile becomes more like the left curve in FIG. 14. Note that the germanium doping peak has a regional concentration much closer to the surface of the substrate, at about 0.2 microns below the surface. The resulting profile of the invention shows that there is more boron in the silicon with the peak concentration closer to the surface, rather than diffused into the silicon bulk or absorbed into the field oxide. This increases $V_{TNF}$ to provide the desired enhanced channel stopping effect. Thus, in the p-well embodiment, the germanium dopant should be placed shallowly, with its peak concentration at or more shallow than the boron concentration peak.

While a conventional local oxidation of silicon (LOCOS) isolation procedure is suggested by the illustrations, the invention is compatible with other isolation schemes, such as sealed interface local oxidation (SILO), PB-LOCOS, etc.

In a CMOS structure a type of reversed procedure may also be employed to achieve a similar effect, as will be described with respect to FIGS. 10 through 12. Here, the germanium is selectively implanted into the n-well rather than the p-well, but also has its peak concentration placed deeper than the boron peak concentration; the opposite of the p-well case. Thus, the diffusion of the boron dopant is relatively uninhibited in the direction toward the growing front of the field oxide, but is inhibited in diffusion in a zone where it coexists with germanium. The end result is that the boron is absorbed more greatly into the above field oxide than would have occurred but for the use of germanium. Here, the $V_{TPF}$ increases because more boron is leached into the oxide, rather than remaining in the silicon. It will be appreciated that the process of the present invention adds considerable process versatility to the method of fabricating channel stops in CMOS structures, since there are many ways of achieving the desired goals.

It was discovered that the use of germanium enhances the structure in unexpected ways, such as by improving the narrow width effect of the n-channel devices in the p-well 36. Thus, the method of this invention provides high $V_{TNF}$ and improved narrow width effect as well.

Figure 7:
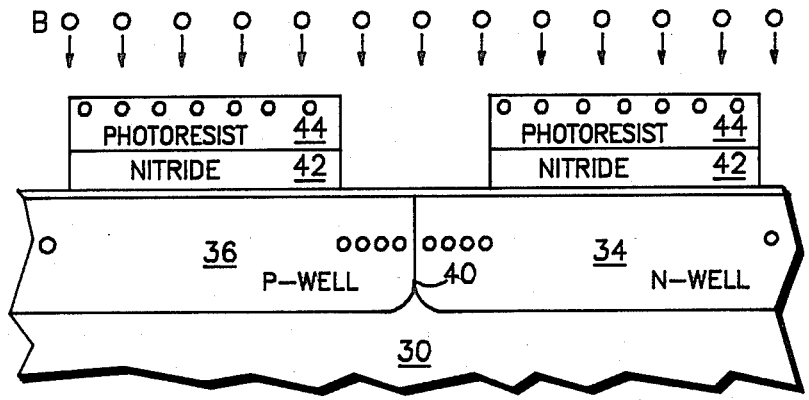
FIG. 7 is a cross-sectional illustration of the structure of FIG. 4 showing a blanket boron ion implantation step, in an alternate embodiment of the method of this invention.
Figure 9:
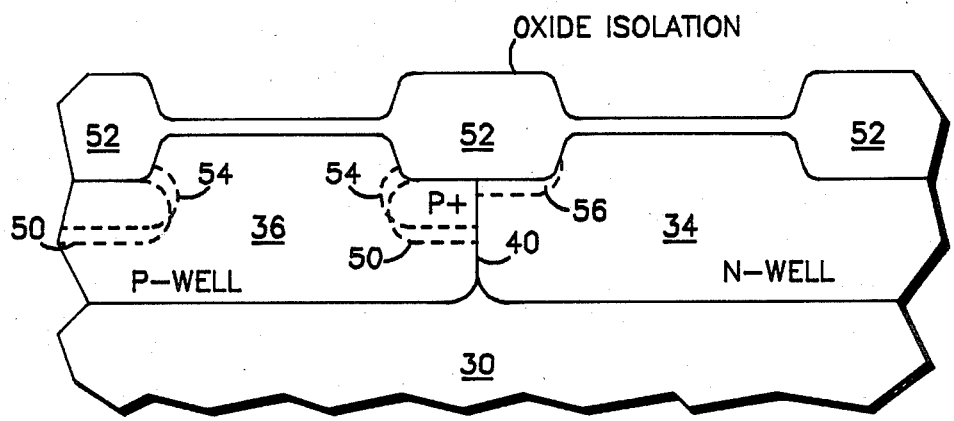
FIG. 9 is a cross-sectional illustration of the isolation structure formed as a result of the processing steps shown in FIGS. 7 and 8.

Shown in FIGS. 7 through 9 is an alternate embodiment of the invention. As shown in FIG. 7, this alternate process employs the intermediate structure of FIG. 4 and performs a blanket or unmasked introduction of boron into the substrate 30, including n-well 34 and p-well 36. Again, the introduction of boron may be conducted using known ion implantation, diffusion, etc. techniques. The future active areas are masked by nitride patterns 42 which may be optionally covered by first photoresist layers 44. An alternative process would remove first photoresist layers 44 prior to the formation of second photoresist mask 48. It will be understood that a hard mask may also be employed or the germanium implantation could be adjusted to meet the desired masking configuration.

Next, as shown in FIG. 8, the second photoresist pattern 48 is applied to cover only the n-well 34 leaving the p-well 36 exposed. Then, the germanium is introduced by any of the known diffusion, ion implantation, etc. techniques as schematically shown in FIG. 8. It will be appreciated that the germanium will be placed only in the p-well 36 adjacent to the interface 40. Since the sequence of the dopant introductions is specified in this embodiment, the germanium will be placed over the boron present. Since the boron is retarded in the presence of germanium, preferential zones of diffusion can be established to favor the diffusion of boron away from the moving silicon oxide/silicon interface, in this case.

Processing proceeds as in the previously discussed embodiment. Photoresists 48 and 44 are stripped off and oxide isolation regions are formed in a heat cycle step. The nitride hard masks 42 are then removed to give the structure shown in FIG. 9. It will be noted that this structure is very similar to the structure seen in FIG. 6 except that, as expected, there is a region of boron 56 beneath the field isolation region 52 at the p-well 36 and n-well 34 interface 40. However, here the region of boron tends to segregate from the n-well and be absorbed into the material of the field oxidation region 52. This is the opposite tendency to that observed on the p-well side as discussed with respect to prior art FIG. 6. Since this absorption occurs in the n-well 34 side, there does not need to be any measure to prevent it.

Indeed, it is often common to incorporate a n+ channel stop region under field isolation region 52 in n-well 34, and, as discussed earlier, the method of the invention may also be employed in such a process. Conventional processes require a high phosphorus concentration or dose in the n-well region 34. This high dose aids in the channel stop function, but degrades the p-channel (PMOS) devices through increased PMOS junction capacitance, increased narrow-width effect, and decreased p+ source/drain breakdown voltage.

Recent experimentation has indeed shown that using germanium implantation in the boron-implanted p-well field regions such as 36 provided significant and unexpected improvement in the electrical isolation properties. Although the physical mechanism for the increase in the threshold voltage is not well understood, experimental results indicate that a modification of the boron segregation and diffusion coefficients may occur due to the presence of germanium during field oxidation.

Figure 10:
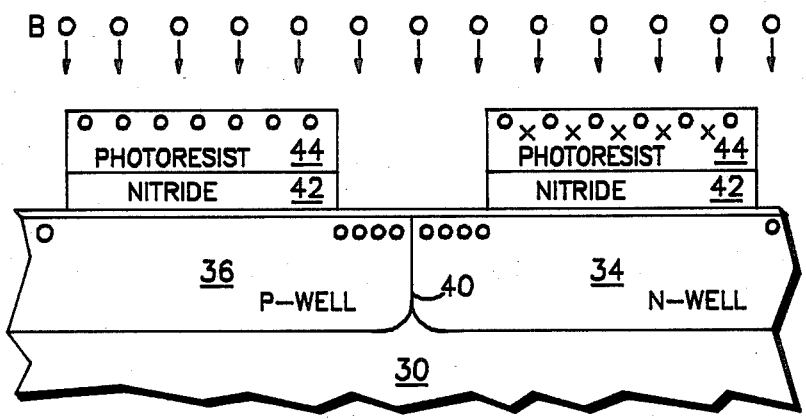
FIG. 10 is a cross-sectional illustration similar to FIG. 7 illustrating another process embodiment of the invention which first utilizes a blanket boron implantation step into both wells.
Figure 11:
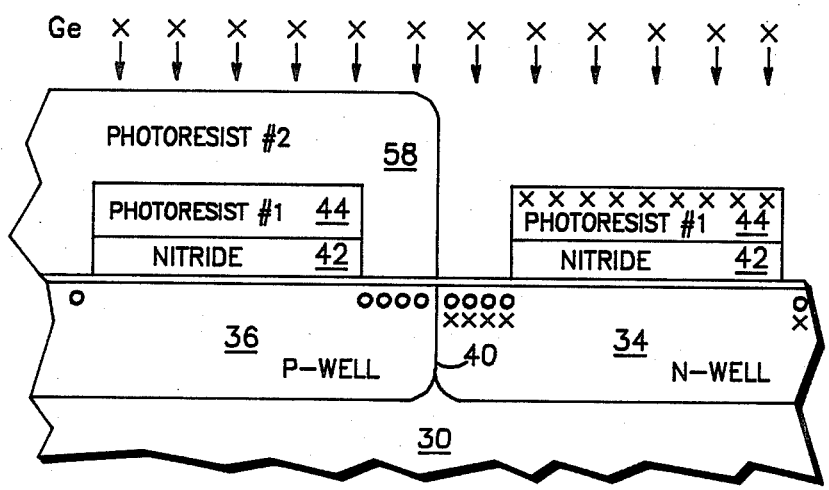
FIG. 11 is a cross-sectional illustration of the CMOS integrated circuit under construction from FIG. 10 where a masked geranium implantation step is being conducted into the channel stop regions for the n-wells.
Figure 12:
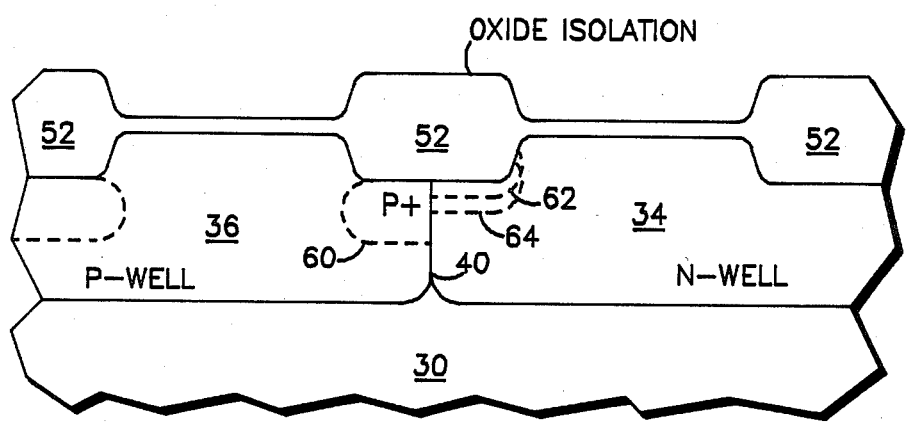
FIG. 12 is a cross-sectional illustration of an alternative embodiment of the isolation structure of the present invention made according to the steps illustrated in FIGS. 10 and 11.

As discussed above, an alternate embodiment of the invention relates to the selective incorporation of germanium into the n-well 34, rather than the p-well 36, as shown in FIGS. 10 and 11. The future active regions remain masked by layer 22, and optionally layer 44, as shown in FIG. 10. Here the peak boron concentration is designed to be placed relatively shallowly, as schematically illustrated by the circles in FIG. 10. It should be noted that the order of these implants may be reversed, however.

Next, the p-well is masked by second photoresist layer 58, and the germanium dopant is placed relatively deeply, as schematically suggested by the x symbols shown in FIG. 11, and contrasted with the boron previously introduced. As noted earlier, first photoresist layer 44 may be present during both steps shown in FIGS. 10 and 11, or alternately removed.

As in the previously described embodiments, an isolation structure 52 is formed by conventional processes using patterned layers 42 as a mask, which are later removed. The result is to provide a structure as shown in FIG. 12, which shows a field oxide region 52 having beneath it a schematically shown p+ channel stop 60 and an absorbed region 62 in the n-well 34 to suggest that most or all of the boron dopant in the n-well has been absorbed into the oxide 52 and prevented from diffusing or forming a "channel stop"-type structure by the germanium peak concentration region 64.

EXAMPLE 1

Figure 13:
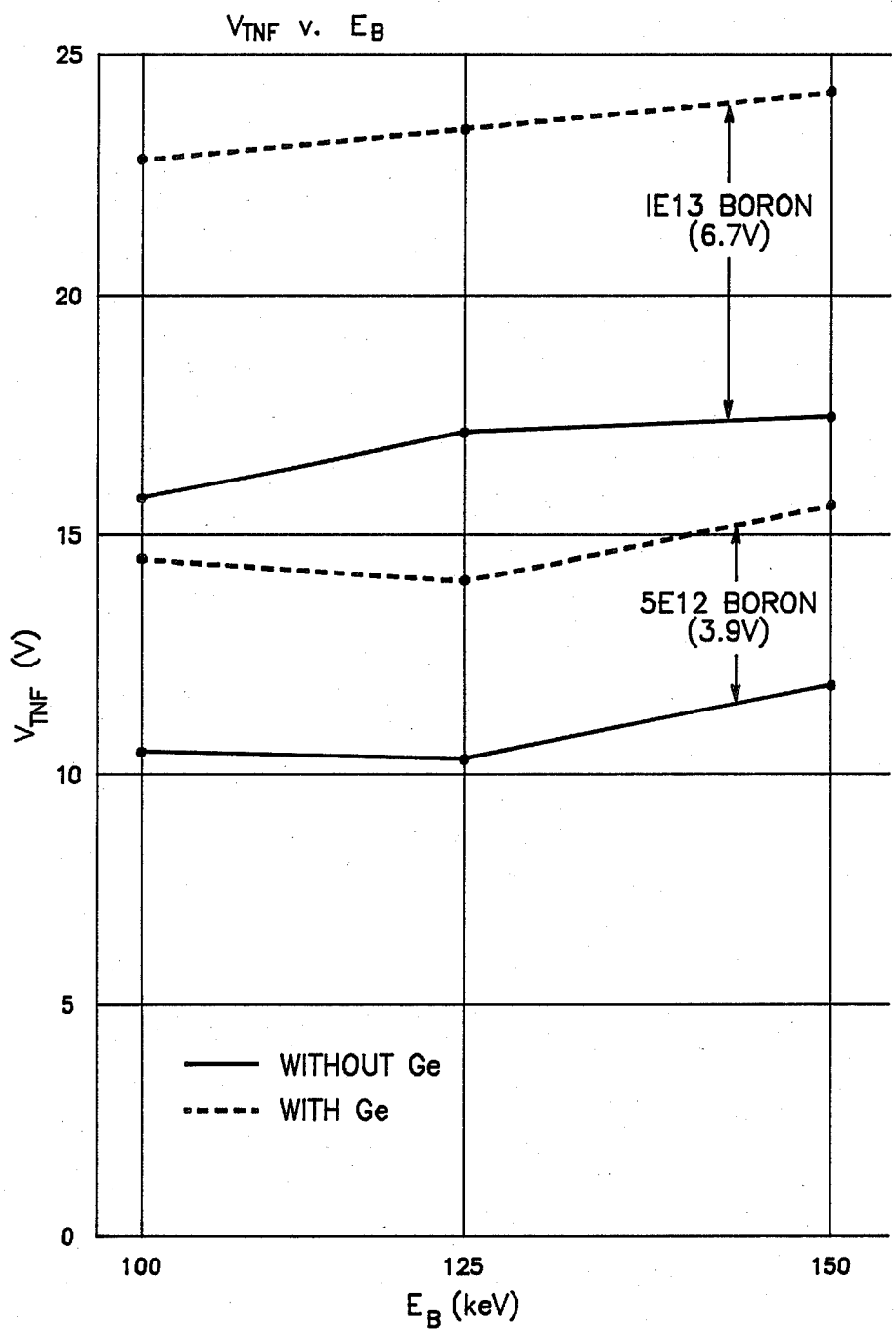
FIG. 13 is a plot of $V_{TNF}$ v. $E_B$ for the capacitors made in Example 1.

This experiment involved the fabrication of large area capacitors which were formed using a LOCOS field oxidation cycle, a 3000 Angstrom in-situ phosphorus doped polysilicon deposition, and a 90 minute anneal at 900° C. to simulate the p-well field region for a 0.8 micron (um) CMOS process. A capacitor on a 154 mil$^2$ test wafer was used to determine the capacitance-voltage characteristics at 1 MHz. The field threshold voltage was calculated by assuming an average flatband voltage of $V_{fb} = -5.50$ V, and an average field oxide thickness of 6300 Angstroms±2.4% (1$\sigma$). Thus, the presence of the germanium in the silicon lattice surprisingly does not affect the thickness of the oxide formed, $T_{ox}$, and the uniformity achieved is very good. Although the field isolation is better characterized by a gate voltage corresponding to a fixed drain current between two adjacent diffusions (as will be described later), the field threshold voltage provides a reasonable benchmark to compare improvements in field isolation. The results for the field threshold voltage are plotted in FIG. 13 as a function of boron implant energy for boron implant does of 5E12 and 1E13 atoms/cm$^2$ with and without a 4E15 atoms/cm$^2$ germanium implant at 60 keV. Note that the use of germanium increases the field threshold voltage by as much as 6.7 V when a 1E13 atoms/cm$^2$ boron implant is used. The boron implant energy was selected to place the "as-implanted" profile close to the expected final oxide/silicon interface.

FIG. 14 plots the boron field concentration profile after field oxidation as a function of vertical distance into the silicon substrate as obtained by SRP analysis. The boron concentration profile is significantly reduced in width, i.e. its extent into the silicon from the wafer surface, possibly due to a retardation in the boron diffusion coefficient. A possible physical mechanism for this retardation in the boron diffusion coefficient has been suggested by one of the inventors to be a strain induced effect caused by the large germanium atom in the silicon lattice.

EXAMPLE 2

Figure 15:
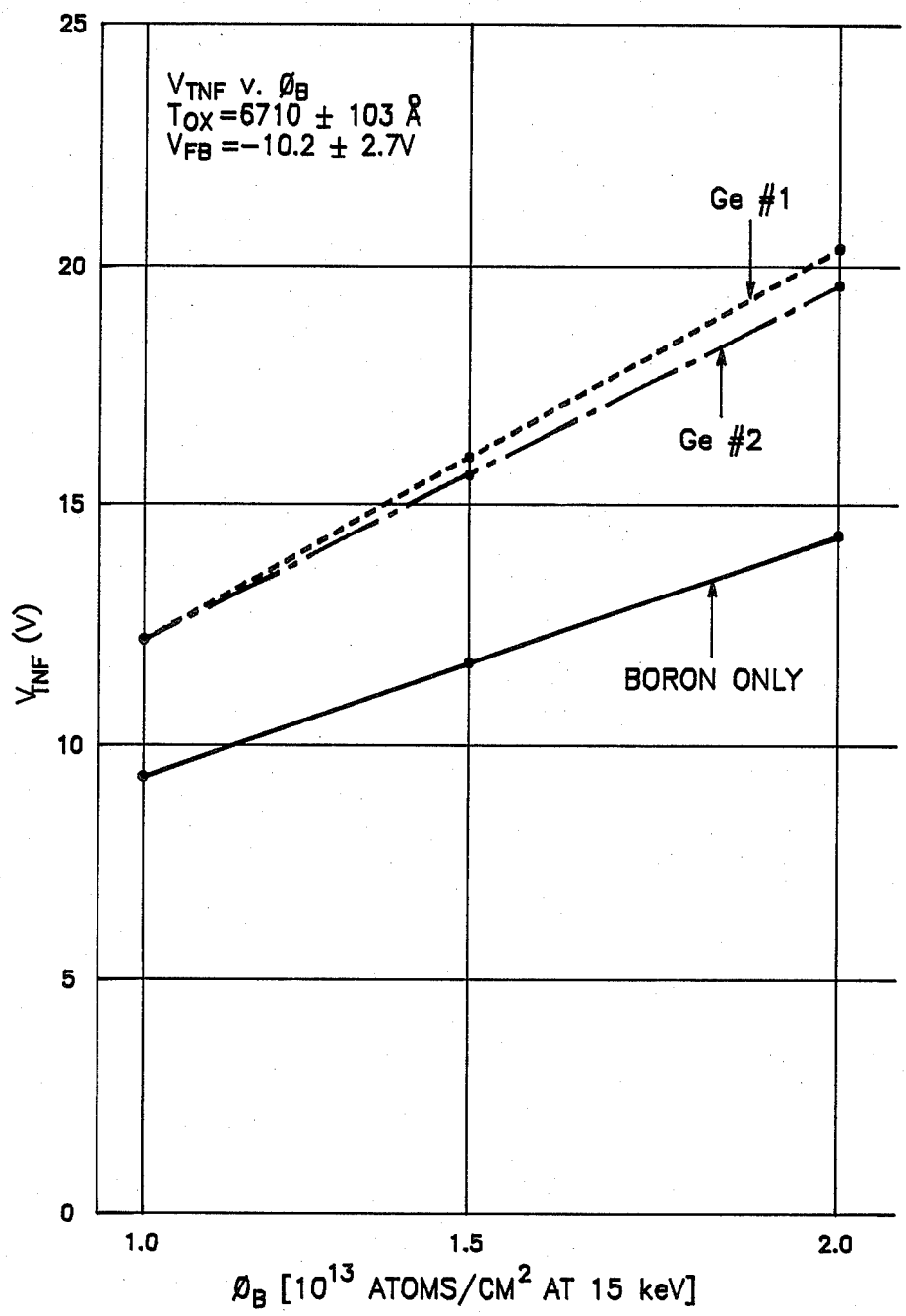
FIG. 15 is a plot of $V_{TNF}$ v. $\phi_B$ characteristics for the structures formed in Example 2.

Another experimental lot was processed to determine the segregation properties of the boron as a result of the germanium implant. A modification of the 1.2 um CMOS process was used and is described by the following sequence: (1) grow 225 Angstrom silicon dioxide layer; (2) optionally perform a 4E15 atoms/cm$^2$ at 125 keV germanium implant (Ge #1); (3) perform a boron implantation of 1.0E12 to 1.0E13 atoms/cm$^2$ at 15 keV implant; (4) perform a boron drive-in anneal of 2 hours at 1025° C. in nitrogen and 2% oxygen; (5) perform an optional 4E15 atoms/cm$^2$ at 125 keV germanium implant (Ge #2); (6) perform a field oxidation (LOCOS) of 3 hours at 1000° C. in hydrogen and oxygen to grow 7500 Angstroms field oxide; and (7) conduct a thermal anneal of 90 minutes at 900° C. in nitrogen. The results for the field threshold voltage, based on a capacitor structure of f=1 MHz, are plotted in FIG. 15 as a function of boron implant dose. The variance in the field threshold voltage is due to a fluctuation in the flatband voltage of −10.2 V+2.7 V. This was observed on many samples, including the boron-only wafers. A straight line was roughly fit to the data and indicates similar field threshold voltages for the Ge #1 and Ge #2 samples. A significant increase in the field threshold voltage results when the germanium implant is used. It is interesting to note that both the Ge #1 and Ge #2 curves result in similar field threshold voltages. This may indicate that the change in the boron segregation coefficient may play an important role in the improvement of the field isolation characteristics.

EXAMPLE 3

Figure 16:
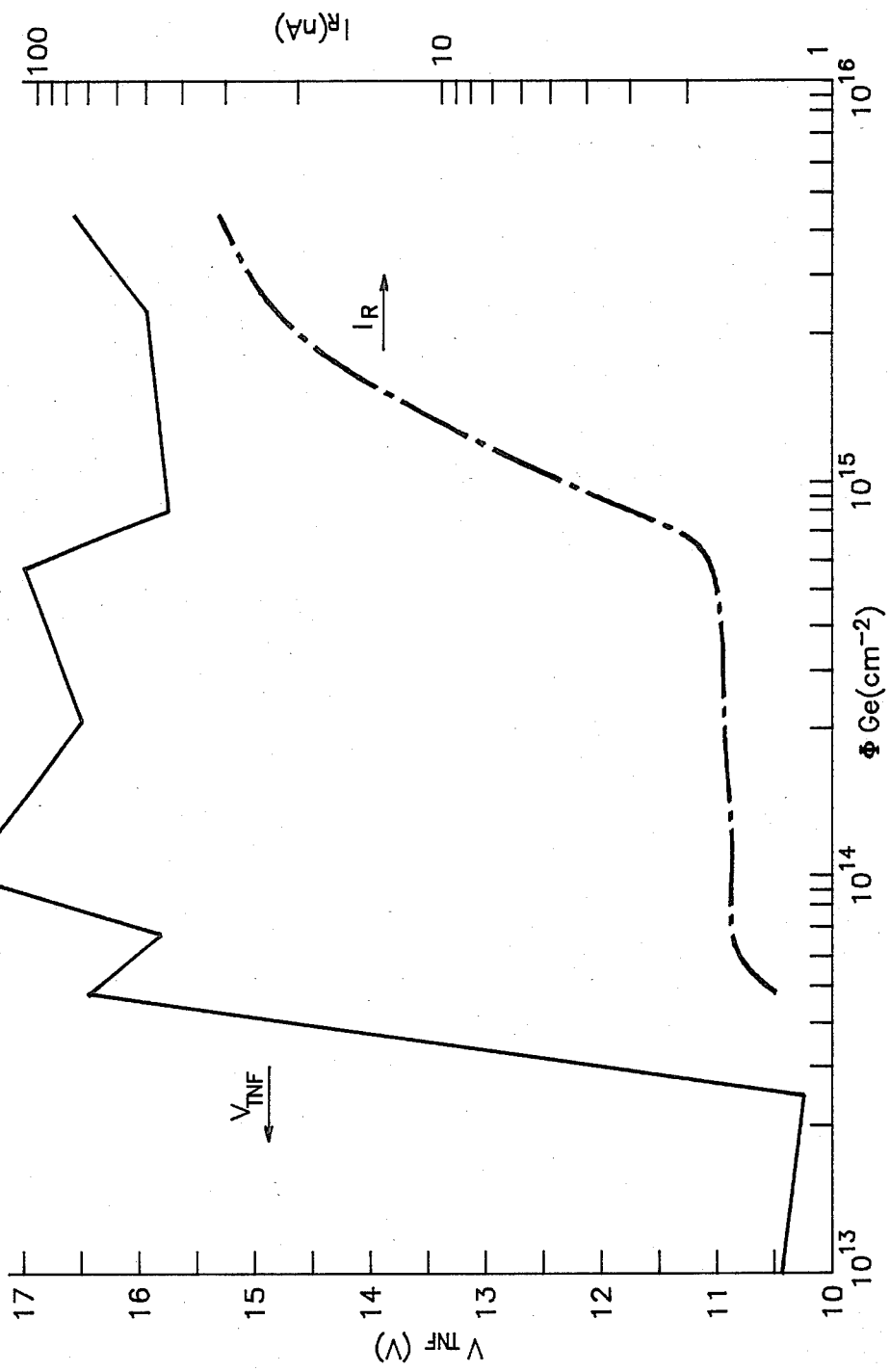
FIG. 16 is a plot of the NMOS field transistor $V_{TNF}$ v. germanium dose and the junction leakage v. germanium dose, for the devices made in connection with Example 3.

An experiment was conducted to determine the threshold germanium implant dose. The boron implant dose was held fixed at 1E13 atoms/cm$^2$ and the germanium implant dose was varied from 1E13 to 5E15 atoms/cm$^2$ at 125 keV. Both the raw data (using the measured flatband voltage and oxide thickness) and the corrected data (using an average flatband voltage and oxide thickness) were studied. It was found that a threshold dose of 5E13 atoms/cm$^2$ of germanium was necessary to observe the increase in field threshold voltage. This indicates that the amorphization effects of germanium, seen for doses greater than 5E14 atoms/cm$^2$, are not responsible for this phenomenon. The decrease in field threshold volatage for germanium doses greater than 1E15 atoms/cm$^2$ may be related to residual ion implantation damage to the silicon lattice. These results, shown in FIG. 16, indicate that the germanium dose may be reduced by two orders of magnitude to achieve the same increase in the field threshold voltage. These results are also confirmed by a plot of junction current leakage, $I_R$, v. $\phi_{Ge}$, also plotted in FIG. 16. It can be seen that a recommended doping dose range for germanium is confirmed from about 5E13 to 5E14 atoms/cm$^2$. The beneficial effect is not achieved until about 5E13, and the $I_R$ becomes undesirably high beyond 5E14. The value of $V_{TNF}$ was also measured for rudimentary field transistors and found to be good for this range, although the results were not as dramatic.

EXAMPLE 4

Figure 17:
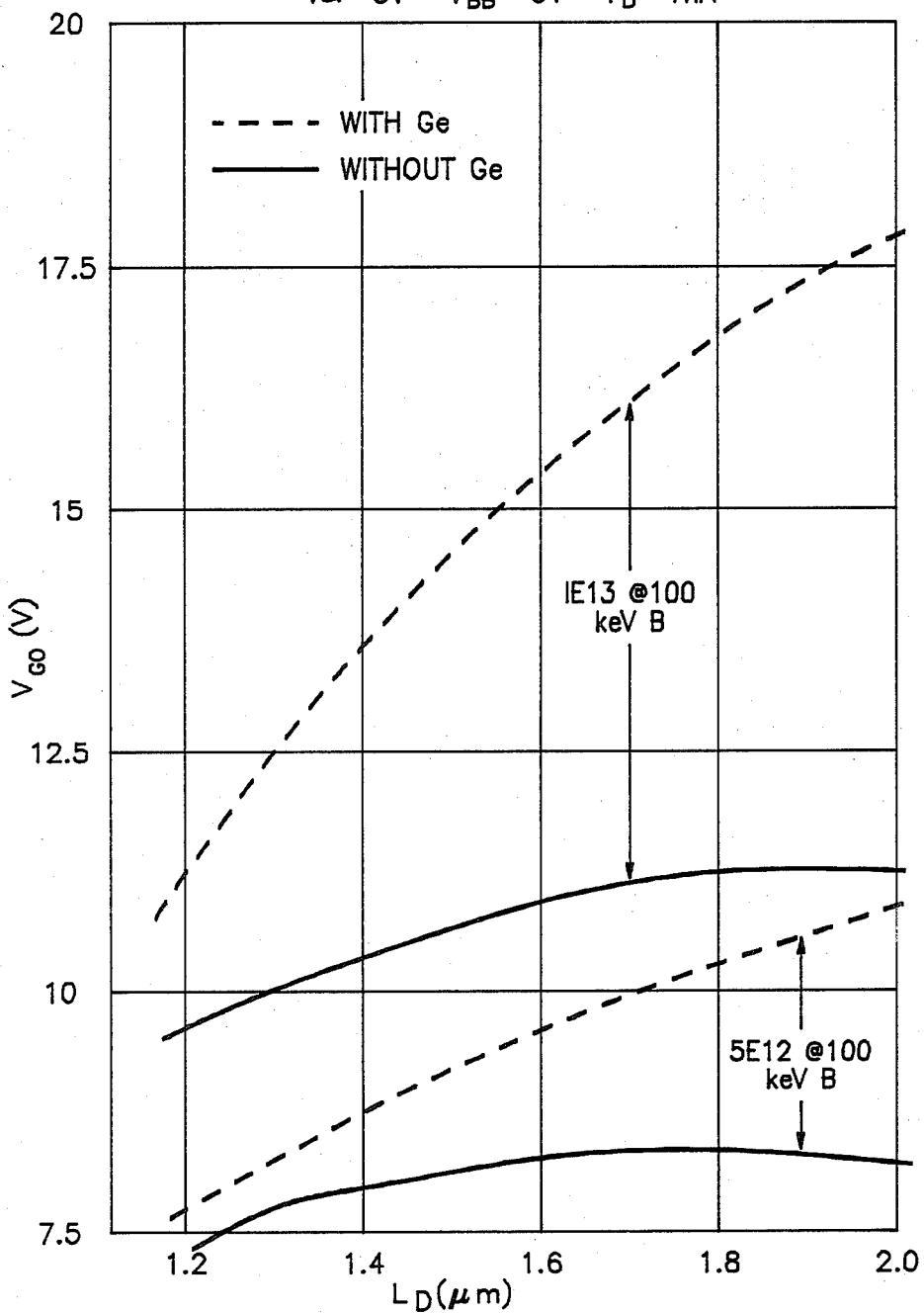
FIG. 17 is a plot of gate voltage, $V_{GO}$, v. $L_D$ for the NMOS field transistor structures made in Example 4.
Figure 18:
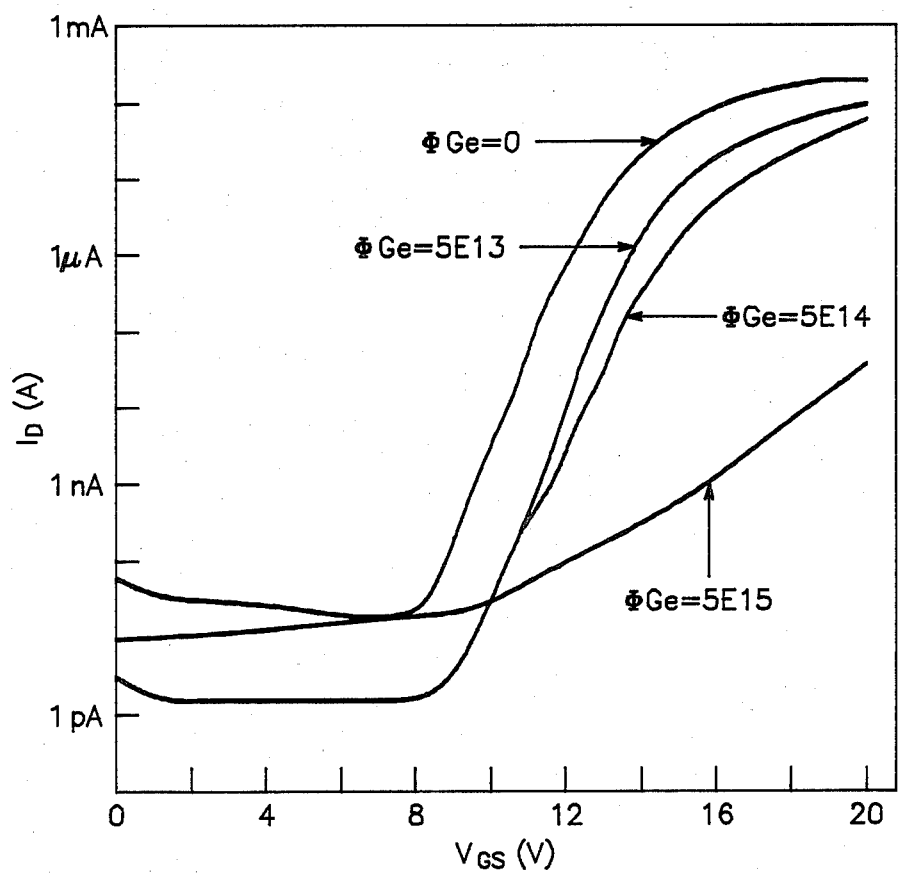
FIG. 18 is a plot of drain current v. gate voltage for the structures made in Example 4.

A full NMOS experimental lot was processed to monitor the effect of the germanium implant in the p-well field region on the short-channel NMOS transistor characteristics and the parasitic field transistors. FIG. 17 plots the gate voltage necessary to maintain 1 nA of drain current, $I_D$, on two adjacent n+ diffusions which are separated by thick field oxide as a function of the drawn diffusion spacing. Again, the use of germanium results in a significant improvement in the field isolation properties. FIG. 18 shows typical field transistor drain current versus gate voltage, $V_G$, curves for a drawn 70/2 (width to length proportions) NMOS field device with and without germanium for a boron field implant dose of 1E13 atoms/cm$^2$. Not only is the field threshold voltage increased, but the inverse subthreshold slope has been increased by as much as a factor of 3.5. In fact, the 5E15 atoms/cm$^2$ implanted germanium samples could not be turned on due to the rupture of the gate oxide caused by the high gate voltages. The narrow width effect was characterized by measuring the peak transconductance and correcting for the series resistance and vertical mobility degradation. It was found that no significant changes in the field-effect mobility or electrical channel width were observed. The threshold voltage shift referenced to a $W_d=2$ um reference was also studied as a function of electrical channel width. Although this data does not provide conclusive evidence of reduced lateral boron diffusion into the active channel region, it does demonstrate the improvement in using germanium with a lower dose of boron. This result is significant since a lower boron dose which results in adequate field isolation would provide an improvement in the narrow width effect. To demonstrate that the presence of germanium in the field region does not degrade the short-channel MOS device off current, the subthreshold drain current v. gate voltage for a 50/0.8 NMOS device with and without germanium in the field region was studied. It was noted that the inverse subthreshold slope is similar. A difference in the off current was attributed to small differences in the $L_{eff}$ since both curves correspond to the same drawn channel dimensions only. Also, no change in junction breakdown voltage or gate oxide breakdown voltage was observed.

Using the information developed above, the concept of placing the germanium implant locally into the silicon substrate, i.e. either in the n-well or the p-well, by use of photolithographic techniques evolved. The inventive process herein would be to either do a non-selective shallow boron implant followed by a selective p-well germanium implant, or a non-selective shallow boron implant followed by a selective n-well germanium implant. This process allows control over the segregation of the boron either into the oxide above the n-well or into the p-well region. As noted earlier, the invention may be practiced with the implants performed in various sequences without departing from the spirit of the invention.

A simulation was performed to determine how the field threshold voltage varied as a function of the boron segregation coefficient. The simulation results suggested that if the boron segregation coefficient is increased from the default value of 0.27 to 1.0, an 8 V increase in the field threshold voltage would occur. Although the physical mechanism for the germanium and boron interactions may be due to both diffusion and segregation kinetics, the simulation predictions are consistent with the observed results summarized above. The simulations of field implant concentrations in the n-and p-wells suggested that when the segregation coefficient is increased to 1.0, the surface concentration is increased by a factor of 6, whereas the phosphorus pile-up phenomenon at the n-well oxide/silicon interface more than compensates for any residual boron. This is for the case where a phosphorus channel stop is employed in the n-well. Other simulated studies of the field threshold voltage as a function of boron implant energy for a dose of 5E12 atoms/cm$^2$ indicates that 90% of the boron would be segregated into the field oxide for a 15 keV implant and the corresponding field threshold for the p-well would increase to 13.5 V if the segregation coefficient was 1.0. These simulation results suggest that a dual implant scheme may be feasible to provide adequate field threshold voltages for both the n-well and p-well without the addition of extra phosphorus in the n-well to compensate the blanket boron implant.

EXAMPLE 5

An experimental lot was processed with and without a 4E15 atoms/cm$^2$ at 125 keV germanium implant for a 15 keV boron implant with doses ranging from 1E12 to 1E13 atoms/cm$^2$. The germanium was selectively placed in the n-well below the boron dopant, which was placed in both the n-well and the p-well adjacent the interface. The field threshold voltage for the n-well was −21.1 V without boron, and −19.4 V with a 1E13 atoms/cm$^2$ at 15 keV boron implant. This result indicates that very little of the boron remains in the n-well region which is consistent with the simulation program's prediction and FIGS. 10 through 12. On the other hand, the p-well showed a decrease in field threshold voltage of approximately 6 V when germanium was used. The 125 keV implant is deeper than the boron implanted profile and may cause additional segregation of boron into the field oxide.

EXAMPLE 6

This experiment further indicates that the implantation of germanium in the field region prior to field oxidation results in a significant reduction of the boron diffusivity and segregation compared to boron-only implanted samples. Results of this experiment show that the field threshold voltage, measured from C-V analysis on a large thick-field oxide capacitor, is a sensitive function of the boron and germanium implantation energy. By correct placement of the germanium implant, the field threshold voltage can be lowered or increased. Thus, an object of the invention is to adjust the n-well and p-well field threshold voltages using one masking step by a nonselective boron implant with a selective (n-well or p-well) germanium implant.

The procedure was an experiment to fabricate thick-oxide capacitors. N and p type <100> silicon wafers were oxidized to grow 300 Angstroms of oxide, followed by a 5E12 atoms/cm$^2$ at 100 keV phosphorus implant and a 5E12 atoms/cm$^2$ at 40 keV boron implant, respectively. The wells were formed using a 4 hour at 1200° C. thermal anneal to adjust the surface concentration to 2E16 atoms/cm$^3$. The oxide was etched, followed by an oxidation to grow 225 Angstroms of silicon dioxide to simulate the active oxidation cycle.

Next, germanium was implanted into the samples with a split on implantation energy, 125 keV v. 150 keV, for a 1E14 atoms/cm$^2$ dose. In addition, some wafers received no germanium implant. Boron was then implanted at a dose of 1E13 atoms/cm$^2$ at 20, 30, 40, and 50 keV. The field oxidation cycle grew 6645 Angstroms of oxide. In-situ phosphorus doped polysilicon was deposited and annealed for 90 minutes at 900° C. to simulate the post inert-ambient thermal cycles of a submicron CMOS process, and to reduce the sheet resistance of the as-deposited poly layer. Poly capacitors were patterned and etched to form large area capacitors.

The results were measured using a 1 MHz oscillation frequency. Using the maximum and minimum capacitance values, the oxide thickness, flatband voltage, effective background doping, and threshold voltage were obtained. The threshold voltage for this experiment was calculated using the effective background doping concentration and flatband voltage assuming that inversion occurs at a surface potential of $2\phi_f$.

Figure 19A:
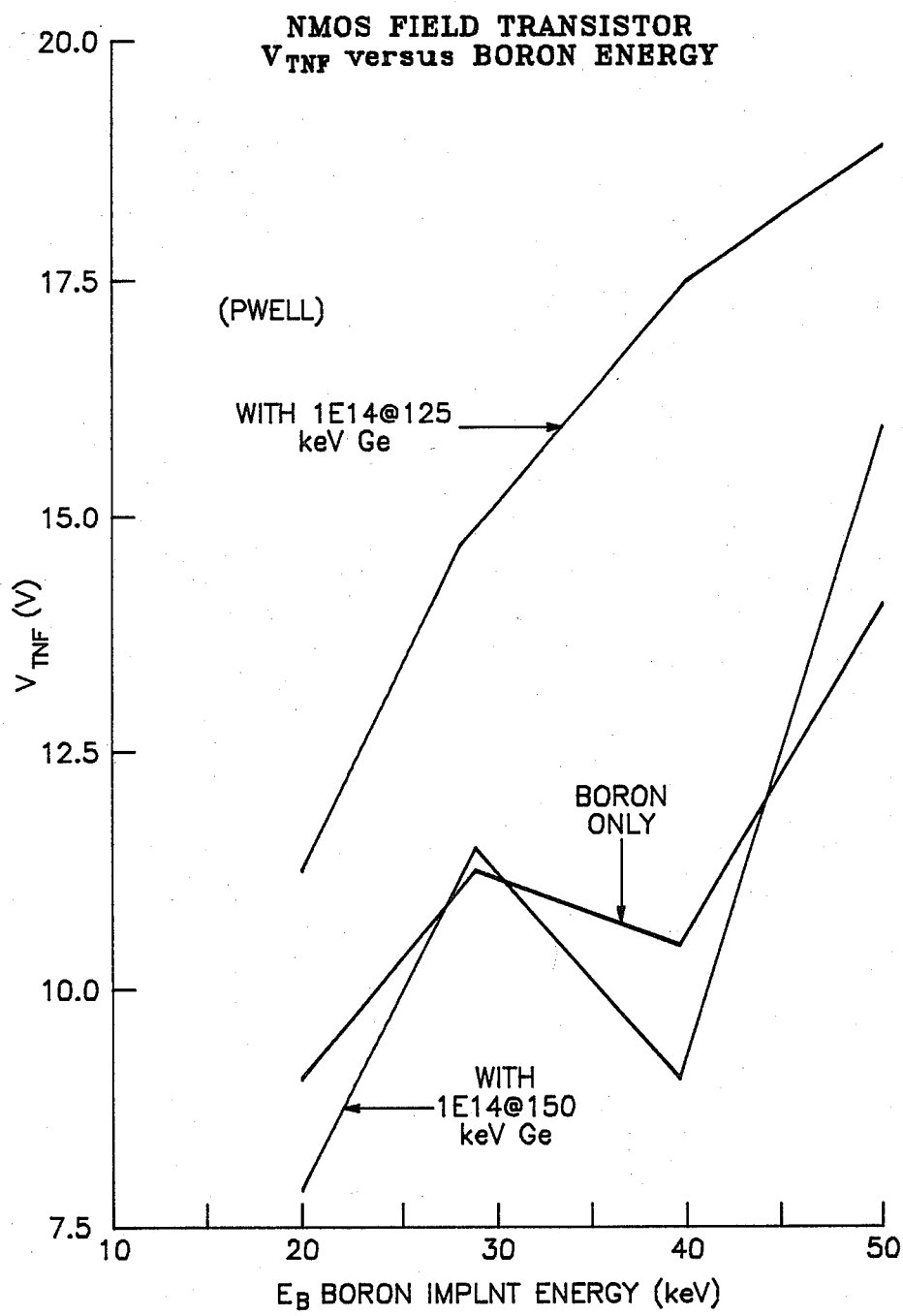
FIGS. 19A and 19B are plots of $V_{TNF}$(volts) v. boron implant energy, $E_B$, for the structures made in the p-wells and n-wells, respectively, of Example 6.
Figure 19B:
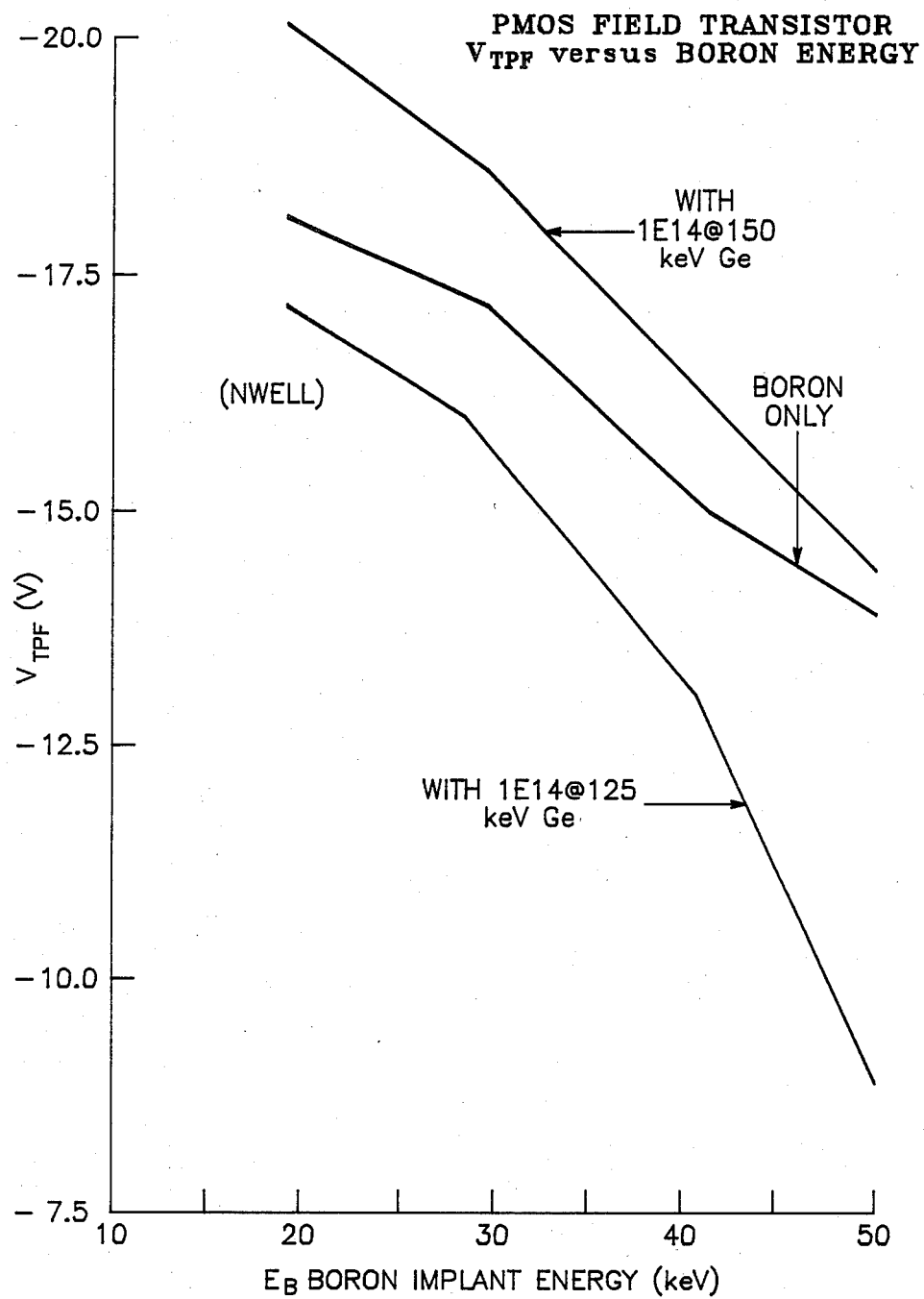

Shown in FIGS. 19A and 19B are plots of the field threshold voltage for the p-well and n-well regions as a function of boron implant energy. The three curves correspond to boron implanted samples only: boron with a 1E14 atoms/cm$^2$ at 125 keV germanium implant, and boron with a 1E14 atoms/cm$^2$ at 150 keV germanium implant. The average field oxide thinness was 6100 Angstroms compared to the measured value of 6645 A obtained during processing. The flatband voltage measurements were $V_{fb}=-6.42$ V and $V_{fb}=-2.68$ V for the p-well and n-well regions, respectively. These results confirm the expected improvement from the processes and structures of the present invention.

For the p-well case, the use of the 125 keV germanium implant has a significant effect on increasing the p-well field threshold voltage. The dip in $V_{TNF}$ at the boron implant energy of 40 keV can be explained by a change in flatband voltage. The 1E14 atoms/cm$^2$ at 125 keV germanium implant appears to increase the field threshold voltage by as much as 3 V.

For the n-well case, the use of the 125 keV germanium implant results in a decrease in the n-well field threshold voltage magnitude. The 150 keV germanium implant appears to increase the field threshold magnitude. The presence of the germanium may cause a change in the boron diffusivity and segregation properties as discussed earlier.

Additional information was obtained from spreading resistance profiling to characterize the use of germanium implantation in the n-well/p-well field regions. Results for the 1E13 atoms/cm$^2$ boron implants at 30 keV and 40 keV using no germanium implant, a 1E14 atoms/cm$^2$ 125 keV germanium implant, and a 1E14 atoms/cm$^2$ at 150 keV germanium implant of Example 6 were examined and found to be consistent with earlier C-V measurements for field threshold voltage and effective background concentration.

It may be seen that a number of unexpected advantages may be provided by the employment of germanium in the channel stop regions at the interface of p- and n-wells in CMOS structures. These include lower doses for the channel stop impurities, more precise placement of the channel stops, increase in the field threshold voltages and reduced mask count by employing a blanket boron channel-stop implant with a selective (masked) germanium implant into either the n-well or the p-well.

We claim:

1. A process for providing isolation structures between areas of different conductivity types in a complementary metal oxide semiconductor (CMOS) integrated circuit comprising the steps of:
   providing a semiconductor substrate having a surface containing areas of different types comprising p-conductivity areas and n-conductivity areas adjacent one another at interfaces;
   providing germanium/second dopant regions in one type of the areas in the substrate, and providing second dopant regions without germanium in the other type of areas in the substrate, where the second dopant is selected from the group consisting of boron and phosphorus, and where the germanium/second dopant regions and the second dopant regions without germanium are adjacent to the interfaces between the different conductivity areas;
   providing a mask over the substrate, where the mask exposes at least the interfaces or structures overlying the interfaces between the p-conductivity areas and the n-conductivity areas; and forming field isolation structures at the interfaces between the p-conductivity areas and the n-conductivity areas, where channel stop regions containing the second dopant form beneath the field isolation structures.

2. The process of claim 1 wherein the provisions of the second dopant and germanium are accomplished by ion implantation.

3. The process of claim 1 wherein the field isolation structure is silicon dioxide.

4. A process for providing isolation structures between areas of different conductivity types in a complementary metal oxide semiconductor (CMOS) integrated circuit comprising the steps of:
providing a semiconductor substrate having a surface containing areas of different types comprising p-conductivity areas and n-conductivity areas adjacent one another at interfaces;
providing a mask over the substrate, where the mask exposes at least the interfaces or structures overlying the interfaces between the p-conductivity areas and the n-conductivity areas;
providing germanium regions in the areas consisting of the p-conductivity areas, the n-conductivity areas or both;
providing a second dopant in the germanium regions, where the second dopant provision is selected from a selective introduction of boron in the germanium region in the p-conductivity area, a selective introduction of phosphorus in the germanium region in the n-conductivity area, and a combination of the two; and
forming field isolation structures at the interfaces between the p-conductivity areas and the n-conductivity areas, where channel stop regions containing at least one of the second dopants form beneath the field isolation structures.

5. A process for providing isolation structures between areas of different conductivity types in a complementary metal oxide semiconductor (CMOS) integrated circuit comprising the steps of:
providing a semiconductor substrate having a surface containing areas of different types comprising p-conductivity areas and n-conductivity areas adjacent one another at interfaces;
providing germanium/boron regions in one type of the areas in the substrate, and providing boron without germanium regions in the other type of areas in the substrate, where the germanium/boron regions and the boron without germanium regions are adjacent to the interfaces between the different conductivity areas;
providing a mask over the substrate, where the mask exposes at least the interfaces or structures overlying the interfaces between the p-conductivity areas and the n-conductivity areas; and
forming field isolation structures at the interfaces between the p-conductivity areas and the n-conductivity areas, where channel stop regions containing the second dopant form beneath the field isolation structures.

6. The process of claim 5 wherein the provisions of boron and germanium are accomplished by ion implantation.

7. The process of claim 5 wherein the field isolation structure is silicon dioxide.

8. A process for providing isolation structures between areas of different conductivity types in a complementary metal oxide semiconductor (CMOS) integrated circuit comprising the steps of:
providing a semiconductor substrate having a surface containing p-conductivity areas and n-conductivity areas adjacent one another at interfaces;
introducing boron into the semiconductor substrate;
introducing germanium into the semiconductor substrate, wherein one of the introductions is a blanket introduction and the other of the introductions is masked for only the p-conductivity areas by means of a first mask;
removing the first mask;
providing a second mask over the substrate, where the second mask exposes at least the interface or a region overlying the interface, between the p-conductivity areas and the n-conductivity areas; and
forming a field isolation structure at the interface between the p-conductivity areas and the n-conductivity areas, where a region of combined boron doping is provided as a channel stop structure beneath the field isolation structure.

9. The process of claim 8 wherein the boron and germanium introductions are accomplished by ion implantation.

10. The process of claim 8 wherein the field isolation structure is silicon dioxide.

11. A process for providing isolation structures between areas of different conductivity types in a complementary metal oxide semiconductor (CMOS) integrated circuit comprising the steps of:
providing a semiconductor substrate having a surface containing p-conductivity areas and n-conductivity areas adjacent one another at interfaces;
introducing boron into both types of areas in an unmasked introduction step;
providing a first mask over the n-conductivity areas;
introducing germanium selectively into the p-conductivity areas;
removing the first mask over the n-conductivity areas;
providing a second mask over the substrate, where the second mask exposes at least the interface or structures overlying the interfaces between the p-conductivity areas and the n-conductivity areas; and
forming field isolation structures at the interfaces between the p-conductivity areas and the n-conductivity areas, where regions of combined germanium and boron doping forms in the p-conductivity areas beneath the field isolation structures.

12. The process of claim 11 wherein the boron and germanium introductions are accomplished by ion implantation.

13. The process of claim 11 wherein the field isolation structure is silicon dioxide.

14. A process for providing isolation structures between areas of different conductivity types in a complementary metal oxide semiconductor (CMOS) integrated circuit comprising the steps of:
providing a semiconductor substrate having a surface containing p-conductivity areas and n-conductivity areas adjacent one another at interfaces;
providing a first mask over the n-conductivity areas;
simultaneously introducing germanium and boron selectively into the p-conductivity areas;
removing the first mask over the n-conductivity areas;

providing a second mask over the substrate, where the second mask exposes at least the interface or structures overlying the interface, between the p-conductivity areas and the n-conductivity areas; and forming field isolation structures at the interfaces between the p-conductivity areas and the n-conductivity areas, where a region of combined germanium and boron doping forms in the p-conductivity areas as a channel stop beneath the field isolation structures.

15. The process of claim 14 wherein the boron and germanium introductions are accomplished by ion implantation.

16. The process of claim 14 wherein the ion implantations have a dose, and the dose of the germanium ion implantation is at least 5E13 atoms/cm$^2$.

17. The process of claim 14 wherein the field isolation structure is silicon dioxide.

18. The process of claim 14 wherein the introduction of germanium into the p-conductivity well provides a germanium peak concentration and the introduction of boron into the p-conductivity well provides a boron peak concentration, and wherein the boron peak concentration is deeper into the p-conductivity well than the germanium peak concentration.

19. The process of claim 16 wherein the ion implantations have a dose, and the dose of the germanium ion implantation is between about 5E13 and 5E15 atoms/cm$^2$.

20. A process for providing isolation structures between areas of different conductivity types in a complementary metal oxide semiconductor (CMOS) integrated circuit comprising the steps of:

providing a semiconductor substrate having a surface containing p-conductivity areas and n-conductivity areas adjacent one another at interfaces;
introducing boron into the semiconductor substrate;
introducing germanium into the semiconductor substrate, wherein one of the introductions is a blanket introduction and the other of the introductions is masked for only the n-conductivity areas by means of a first mask;
removing the first mask;
providing a second mask over the substrate, where the second mask exposes at least the interface or a region overlying the interface, between the p-conductivity areas and the n-conductivity areas; and
forming a field isolation structure at the interface between the p-conductivity areas and the n-conductivity areas, where a region of boron doping is provided as a channel stop structure beneath the field isolation structure.

21. A process for providing isolation structures between areas of different conductivity types in a complementary metal oxide semiconductor (CMOS) integrated circuit comprising the steps of:

providing a semiconductor substrate having a surface containing p-conductivity areas and n-conductivity areas adjacent one another at interfaces;
providing a first mask over the p-conductivity areas;
introducing germanium selectively into the n-conductivity areas;
removing the first mask over the p-conductivity areas;
introducing boron into both types of areas in an unmasked introduction step;
providing a second mask over the substrate, where the second mask exposes at least the interface or structures overlying the interfaces between the p-conductivity areas and the n-conductivity areas; and
forming field isolation structures at the interfaces between the p-conductivity areas and the n-conductivity areas, where channel stop regions of boron doping forms in the p-conductivity areas beneath the field isolation structures.

22. The process of claim 21 wherein the introduction of germanium into the n-conductivity well provides a germanium peak concentration and the introduction of boron into the n-conductivity well provides a boron peak concentration, and wherein the germanium peak concentration is deeper into the n-conductivity well than the boron peak concentration.

* * * * *